(12) United States Patent
Fu et al.

(10) Patent No.: US 10,613,381 B2
(45) Date of Patent: Apr. 7, 2020

(54) DIFFUSION PLATE AND DIRECT-TYPE BACKLIGHT MODULE

(71) Applicant: HUIZHOU CHINA STAR OPTOELECTRONICS TECHNOLOGY CO., LTD., Huizhou Guangdong (CN)

(72) Inventors: Linlin Fu, Huizhou Guangdong (CN); Xiaoyu He, Huizhou Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 165 days.

(21) Appl. No.: 15/743,019

(22) PCT Filed: Jan. 4, 2018

(86) PCT No.: PCT/CN2018/071410
§ 371 (c)(1),
(2) Date: Jan. 9, 2018

(87) PCT Pub. No.: WO2019/109448
PCT Pub. Date: Jun. 13, 2019

(65) Prior Publication Data
US 2019/0324325 A1    Oct. 24, 2019

(30) Foreign Application Priority Data

Dec. 8, 2017  (CN) .......................... 2017 1 1298265

(51) Int. Cl.
*G02F 1/133*        (2006.01)
*G02F 1/1335*      (2006.01)
(Continued)

(52) U.S. Cl.
CPC .. *G02F 1/133606* (2013.01); *G02F 1/133603* (2013.01); *G02F 1/133605* (2013.01); *H01L 25/0753* (2013.01); *H01L 33/60* (2013.01)

(58) Field of Classification Search
CPC ......... G02F 1/133603; G02F 1/133605; G02F 1/133606
See application file for complete search history.

(56) References Cited

FOREIGN PATENT DOCUMENTS

| CN | 101131440 A | 2/2008 |
|----|-------------|--------|
| CN | 101191848 A | 6/2008 |

(Continued)

OTHER PUBLICATIONS

CN103511913A English machine translation (Year: 2014).*

*Primary Examiner* — Anne M Hines
(74) *Attorney, Agent, or Firm* — Hemisphere Law, PLLC; Zhigang Ma

(57) ABSTRACT

The present invention provides a diffusion plate and a direct-type backlight module. By disposing the first groove on the light incident side of the second structure layer of the diffusion plate, disposing the second groove or the third protrusions on the light emitting side of the second structure layer, and the refractive index of the first structure layer, the second structure layer and the third structure layer is sequentially increased, the divergence angles of the incident light can be significantly increased, to achieve uniform backlight brightness. The direct-type backlight module of the present application includes the diffusion plate described above. The mura problem can be solved while reducing the number of the LED lamps and the light mixing distance, so as to realize the low cost and slim design of the direct-type backlight module, and are conducive to the use of the direct-type backlight module in the ultra-thin TV field.

17 Claims, 10 Drawing Sheets

(51) Int. Cl.
*H01L 25/075* (2006.01)
*H01L 33/60* (2010.01)

(56) References Cited

FOREIGN PATENT DOCUMENTS

| | | | |
|---|---|---|---|
| CN | 101196584 A | | 6/2008 |
| CN | 101587203 A | | 11/2009 |
| CN | 202486341 U | | 10/2012 |
| CN | 102798908 A | | 11/2012 |
| CN | 103511913 A | * | 1/2014 |
| CN | 103511913 A | | 1/2014 |
| KR | 10-2010-0001581 A | | 1/2010 |

* cited by examiner

DIFFUSION PLATE AND DIRECT-TYPE BACKLIGHT MODULE

RELATED APPLICATIONS

The present application is a National Phase of International Application Number PCT/CN2018/071410, filed on Jan. 4, 2018, and claims the priority of China Application 201711298265.4, filed on Dec. 8, 2017.

FIELD OF THE DISCLOSURE

The disclosure relates to a display technical field, and more particularly to a diffusion plate and a direct-type backlight module.

BACKGROUND

Liquid crystal displays (LCDs) have many advantages such as thin body, low power consumption and no radiation, and are widely used in mobile phones, personal digital assistants (PDAs), digital cameras, computer panels and panel of notebook and so on.

Most liquid crystal display devices on the market are backlight type liquid crystal display devices, which include a housing, a liquid crystal panel disposed in the housing, and a backlight module disposed in the housing. The structure of a conventional liquid crystal panel is composed of a color filter substrate, a thin film transistor array substrate (TFT Array Substrate), and a liquid crystal layer disposed between the two substrates. The working principle is that the driving voltage is applied to the two substrates to control the rotation of the liquid crystal molecules of the liquid crystal layer, and the light of the backlight module is reflected to generate an image. Since the liquid crystal panel itself does not emit light, the light source provided by the backlight module needs to be used to display the image normally. Therefore, the backlight module is one of the key components of the liquid crystal display device. The backlight module is divided into an edge-type backlight module and a direct-type backlight module according to different positions of the light source incident. In the direct-type backlight module, a light source such as a cold cathode fluorescent lamp (CCFL) or a light emitting diode (LED) is disposed behind the liquid crystal panel, and the surface light source is directly formed and provided to the liquid crystal panel. The edge-type backlight module is provided with a backlight source LED light bar located at the edge of the backplane disposed on the lateral back of the liquid crystal panel. The light emitted by the LED light bar enters the light guide plate (LGP) from a side of the light incident surface of the light guide plate, and is emitted from the light emitting surface of the light guide plate after reflecting and diffusing, and then passed through the optical film set to form a surface light source provided to the liquid crystal panel.

As higher and higher requirements to the appearance of television (TV), notebook computers (laptops) and other electronic display products by the consumers, more and more consumers pay more attention to the slim design and narrow bezel design of TV sets. Currently, the edge-type backlight module can quickly achieve thin TV by ways to reduce of LED size, light guide plate thickness, film thickness or the use of full Lamination and occupy the field of ultra-thin TV market. However, since the price of the light guide plate in the edge-type backlight module is relatively high, and the number of LED chips used is relatively large, making it easier to reach a thin profile, but it has no cost advantage and cannot be implemented at the low-end consumer groups to have a wide range of markets. Compared with the edge-type backlight module, due to the lower price of the diffusion plate of the direct-type backlight module in same size, the number of LED chips used is relatively small to have a clear price advantage, but due to design limitation, the closer the distance of the diffusion plates and LED, the LED mura is more likely to be generated, and the taste is poor. If the direct-type backlight module needs to pass the taste, it needs to ensure sufficient optical distance (OD) between the diffusion plate and the reflective sheet, or by increasing the number of LED to prevent the emergence of the problem. However, increasing the OD value will result in a larger thickness, resulting in the direct-type backlight module cannot get the ultra-thin TV market. Increasing the number of the LED will increase the cost and weaken the cost advantage of the direct backlight module.

FIG. 1 shows the principle of generating the mura problem in the direct-type backlight module, and FIG. 2 shows a schematic view of the mura phenomenon occurring in a light emitting surface of a direct-type backlight module. As shown in FIG. 1, the principle of the mura problem is: since the light emitting angle of the LED lamp 610 has a limitation, non-luminous dark areas between the adjacent LED lamps 610 and the light emitting area of the nearby LED lamp 610 form an image with uneven brightness and darkness, after the light passes through the diffusion plate 500 and the optical film 800, the diffusion plate 500 and the optical film 800 have a certain diffusion effect on the light, but are not enough to change the unevenness of light and darkness, thus causing the problem of mura. At present, the solution to the mura problem is to reduce the LED spacing or increase the OD value. Both of these methods have disadvantages. The first method needs to increase the number of LED lamps 610, thereby increasing the backlight module cost. The second method is unfavorable to ultra-slim design, and affects TV appearance. Therefore, there is an urgent need in the industry for a solution to the mura problem without increasing the number of LED lamps 610 and increasing the OD, so as to realize the low cost and ultra-slim design of the direct-type backlight module, and further achieve the slim design of the entire TV set.

SUMMARY

An object of the present invention is to provide a diffusion plate that can significantly increase the divergence angle of the incident light, to achieve uniform brightness of the backlight.

Another object of the present invention is to provide a direct-type backlight module, including the above diffusion plate, to solve the mura problem while reducing the number of led lamps and reducing the light mixing distance, so as to achieve the low cost and slim design of the direct-type backlight module.

To achieve the above object, the present invention provides a diffusion plate, including a first structure layer, a second structure layer and a third structure layer disposed from top to bottom sequentially, wherein a side of the third structure layer far from the second structure layer is a light incident side;

Defining a refractive index of the first structure layer as $n_1$, a refractive index of the second structure layer as $n_2$, and the refractive index of the third structure layer as $n_3$, and $n_1 < n_2 < n_3$;

A contact surface between the first structure layer and the second structure layer in closely contact, a contact surface between the second structure layer and the third structure layer in closely contact; and Wherein a plurality of first grooves is provided on a surface of the second structure layer in contact with the third structure layer, a plurality of first protrusions is provided on a surface of the third structure layer in contact with the second structure layer, shapes and sizes of the first protrusions coincide with shapes and sizes of the first grooves, respectively.

Wherein a hollowed portion of the first groove is a part of an ellipsoid, specifically less than or equal to one-half of the ellipsoid, the ellipsoid is a geometric body surrounded by an ellipse rotating around a long axis of the ellipse, the long axis of the ellipsoid is parallel to the second structural layer; and An opening of the first groove is oval, defining a length of a long axis of the opening of the first groove is d1, a distance from a lowest point of the first groove to the opening is h1, and h1<d1.

Wherein the hollowed portion of the first groove is one-half of the ellipsoid.

Wherein a curve coefficient of the first groove is 0.4~0.7, the refractive index of $n_1$, $n_2$, $n_3$ meets the following relationship of $n_3/n_2<1.3$ and $n_2/n_1<1.3$.

Wherein a contact surface between the second structure layer and the first structure layer has a plurality of second grooves, the contact surface between the first structure layer and the second structure layer has a plurality of second protrusions, shapes and sizes of the second protrusions coincide with shapes and sizes of the second grooves, respectively.

Wherein a hollowed portion of the second groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the second structural layer; and An opening of the second groove is oval, defining a length of a long axis of the opening of the second groove is d2, a distance from a lowest point of the second groove to the opening is h2, and h2<d2.

Wherein a plurality of first grooves is provided on a surface of the second structure layer in contact with the third structure layer, a plurality of first protrusions is provided on a surface of the third structure layer in contact with the second structure layer, shapes and sizes of the third protrusions coincide with shapes and sizes of the third grooves, respectively.

Wherein a hollowed portion of the third groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the first structural layer; and An opening of the third groove is oval, defining a length of a long axis of the opening of the third groove is d3, a distance from a lowest point of the third groove to the opening is h3, and h3<d3.

The present application further provides a direct-type backlight module, including a light source, a diffusion plate disposed on a light emitting side of the light source, the third structure layer of the diffusion plate disposed toward the light source.

Wherein the light source includes a plurality of led lamps arranged at intervals, and the direct-type backlight module further includes a reflection sheet disposed on a side of the light source away from the diffusion plate and an optical film disposed on a side of the diffusion plate away from the light source.

The present apparition further provides a diffusion plate, including: a first structure layer, a second structure layer and a third structure layer disposed from top to bottom sequentially, wherein a side of the third structure layer far from the second structure layer is a light incident side;

Defining a refractive index of the first structure layer as $n_1$, a refractive index of the second structure layer as $n_2$, and the refractive index of the third structure layer as $n_3$, and $n_1<n_2<n_3$;

A contact surface between the first structure layer and the second structure layer in closely contact, a contact surface between the second structure layer and the third structure layer in closely contact;

Wherein t a plurality of first grooves is provided on a surface of the second structure layer in contact with the third structure layer, a plurality of first protrusions is provided on a surface of the third structure layer in contact with the second structure layer, shapes and sizes of the first protrusions coincide with shapes and sizes of the first grooves, respectively;

Wherein a hollowed portion of the first groove is a part of an ellipsoid, specifically less than or equal to one-half of the ellipsoid, the ellipsoid is a geometric body surrounded by an ellipse rotating around a long axis of the ellipse, the long axis of the ellipsoid is parallel to the second structural layer;

An opening of the first groove is oval, defining a length of a long axis of the opening of the first groove is d1, a distance from a lowest point of the first groove to the opening is h1, and h1<d1;

Wherein the hollowed portion of the first groove is one-half of the ellipsoid;

Wherein a contact surface between the second structure layer and the first structure layer has a plurality of second grooves, the contact surface between the first structure layer and the second structure layer has a plurality of second protrusions, shapes and sizes of the second protrusions coincide with shapes and sizes of the second grooves, respectively;

Wherein a hollowed portion of the second groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the second structural layer; and An opening of the second groove is oval, defining a length of a long axis of the opening of the second groove is d2, a distance from a lowest point of the second groove to the opening is h2, and h2<d2.

Beneficial effects of the present invention: the present invention provides a diffusion plate and a direct-type backlight module. By disposing the first groove on the light incident side of the second structure layer of the diffusion plate, disposing the second groove or the third protrusions on the light emitting side of the second structure layer, and the refractive index of the first structure layer, the second structure layer and the third structure layer is sequentially increased, the divergence angles of the incident light can be significantly increased, to achieve uniform backlight brightness. The direct-type backlight module of the present application includes the diffusion plate described above. Since the diffusion plate is excellent in diffusing light, the mura problem can be solved while reducing the number of the LED lamps and the light mixing distance, so as to realize the low cost and slim design of the direct-type backlight module, and are conducive to the use of the direct-type backlight module in the ultra-thin TV field.

For further understanding of the features and technical contents of the present invention, reference should be made to the following detailed description and accompanying drawings of the present invention. However, the drawings are for reference only and are not intended to limit the present invention.

BRIEF DESCRIPTION OF THE DRAWINGS

The technical solutions of the present invention and other beneficial effects will be apparent from the following detailed description of specific embodiments of the present invention with reference to the accompanying drawings.

In the drawings.

DETAILED DESCRIPTION OF PREFERRED EMBODIMENTS

Figure 1:
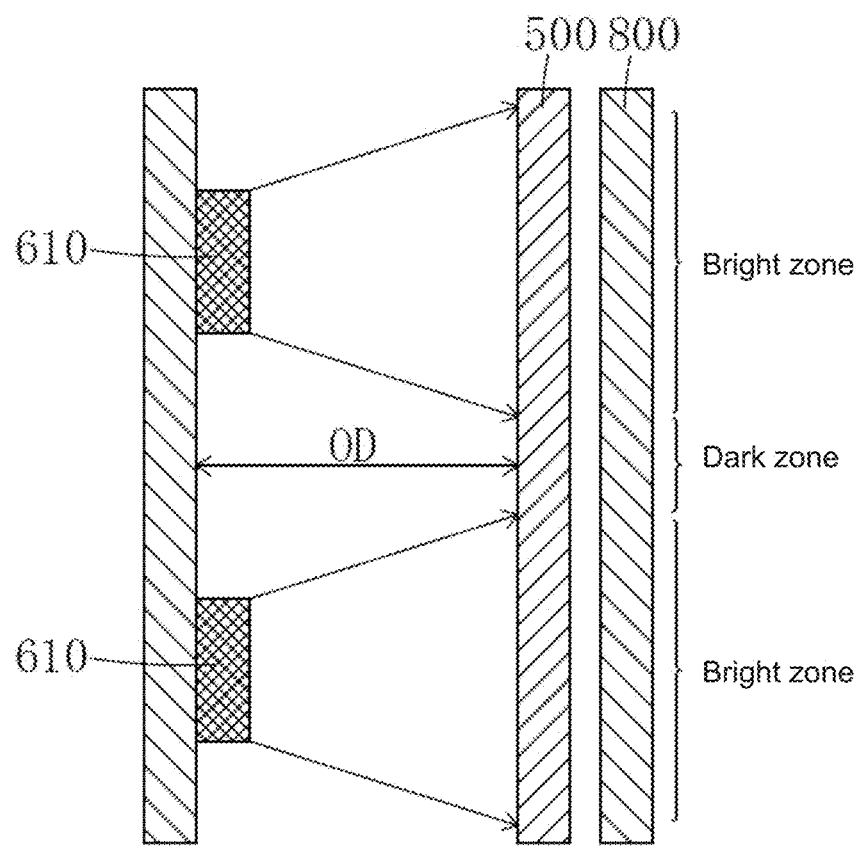
FIG. 1 shows the principle of generating the mura problem in the direct-type backlight module.
Figure 2:
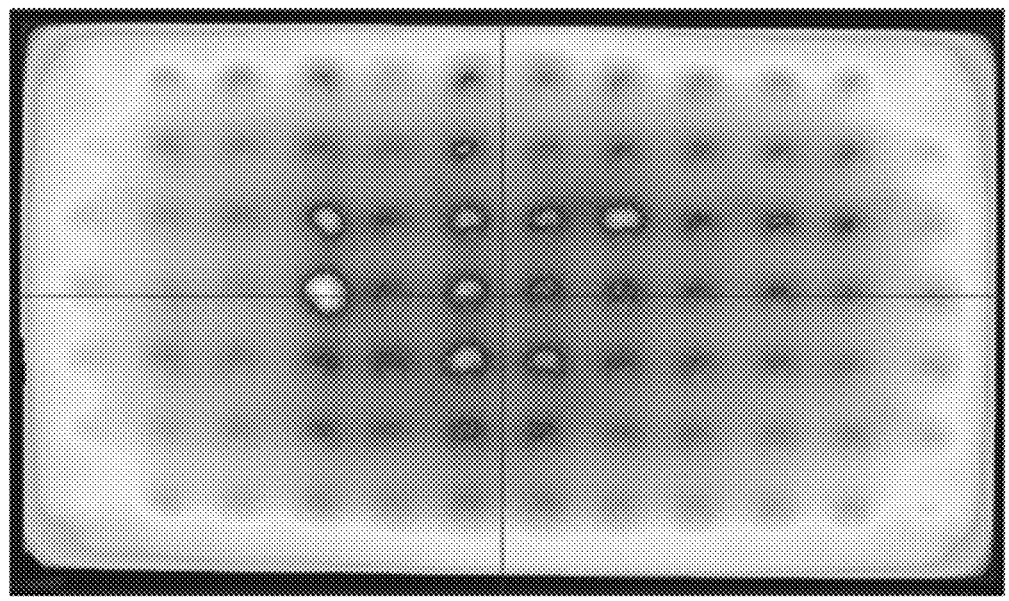
FIG. 2 shows a schematic view of the mura phenomenon occurring in a light emitting surface of a direct-type backlight module.

To further illustrate the technical means adopted by the present invention and the effects thereof, the following describes the preferred embodiments of the present invention and the accompanying drawings in detail.

Referring to FIG. 3 to FIG. 5C, is a first embodiment of the diffusion plate 50 according to the present invention, the diffusion plate 50 includes a first structure layer 10, a second structure layer 20 and a third structure layer 30 disposed from top to bottom sequentially; a side of the third structure layer 30 far from the second structure layer 20 is a light incident side;

Defining the refractive index of the first structure layer 10 is $n_1$, the refractive index of the second structure layer 20 is $n_2$, and the refractive index of the third structure layer 30 is $n_3$, and $n_1 < n_2 < n_3$;

The contact surface between the first structure layer 10 and the second structure layer 20 is in closely contact; the contact surface between the second structure layer 20 and the third structure layer 30 is in closely contact;

The surface of the second structure layer 20 in contact with the third structure layer 30 has a plurality of first grooves 21, the surface of the third structure layer 30 in contact with the second structure layer 20 has a plurality of first protrusions 31, the shapes and the sizes of the first protrusions 31 coincide with the shapes and the sizes of the first grooves 21, respectively.

Figure 5A:
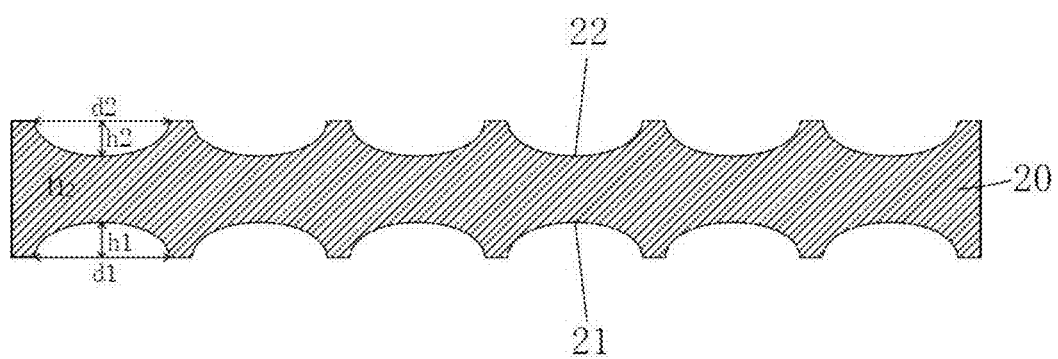
FIG. 5A is a schematic cross-sectional view of the second structure layer of the diffusion plate in the first embodiment of the present invention.
Figure 5B:
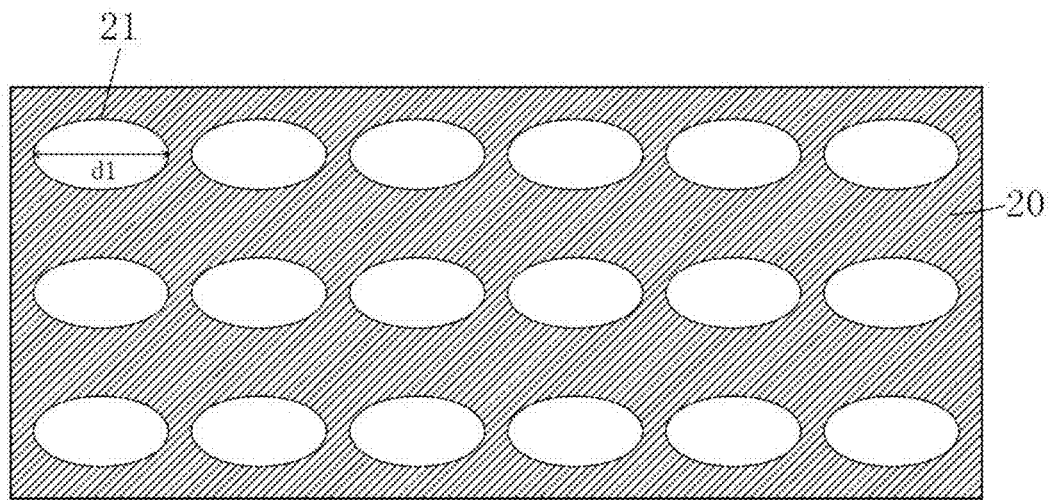
FIG. 5B is a schematic bottom view of the second structure layer of the diffusion plate in the first embodiment of the present invention.

As shown in FIG. 5A and FIG. 5B, the hollowed portion of the first groove 21 is a part of an ellipsoid, specifically less than or equal to one-half of an ellipsoid, the ellipsoid is a geometric body surrounded by an ellipse rotating around a long axis thereof, the long axis of the ellipsoid is parallel to the second structural layer 20;

The opening of the first groove 21 is oval, defining the length of the long axis of the opening of the first groove 21 is d1, the distance from the lowest point of the first groove 21 to the opening is h1, then h1<d1.

Preferably, the hollowed portion of the first groove 21 is one-half of an ellipsoid.

Specifically, the plurality of first grooves 21 is arranged in an array on the second structure layer 20.

Specifically, the plurality of first grooves 21 has the same shape and size.

Specifically, a surface of the second structure layer 20 in contact with the first structure layer 10 has a plurality of second grooves 22, and a surface of the first structure layer 10 in contact with the second structure layer 20 has a plurality of second protrusions 12, the shapes and the sizes of the second protrusions 12 coincide with the shapes and the sizes of the second grooves 22, respectively.

Figure 5C:
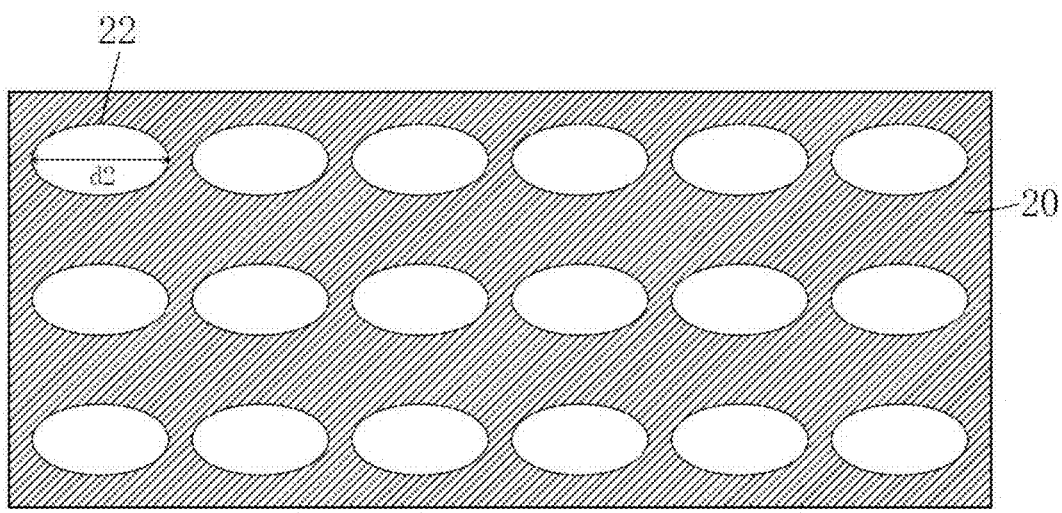
FIG. 5C is a top schematic view of the second structure layer of the diffusion plate in the first embodiment of the present invention.

As shown in FIG. 5A and FIG. 5C, the hollowed portion of the second groove 22 is a part of an ellipsoid, specifically less than or equal to one-half of an ellipsoid, the ellipsoid is a geometric body surrounded by an ellipse rotating around a long axis thereof, the long axis of the ellipsoid is parallel to the second structural layer 20;

The opening of the second groove 22 is oval, defining the length of the long axis of the opening of the second groove 22 is d2, the distance from the lowest point of the second groove 22 to the opening is h2, then h2<d2.

Preferably, the hollowed portion of the second groove 22 is one-half of an ellipsoid.

Specifically, the plurality of second grooves 22 are respectively disposed corresponding to the plurality of first grooves 21.

Specifically, the second groove 22 has the same shape and size as the first groove 21.

Figure 6A:
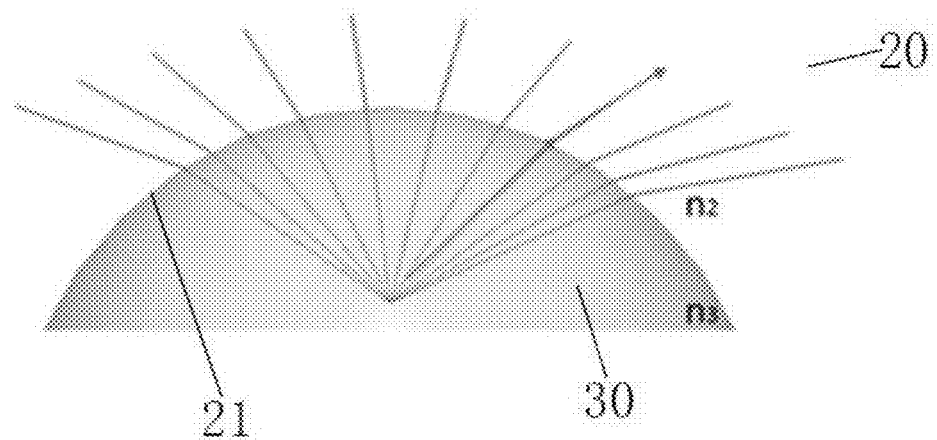
FIG. 6A is a schematic view of diffusion effect of the incident light on a first groove in the second structural layer.
Figure 6B:
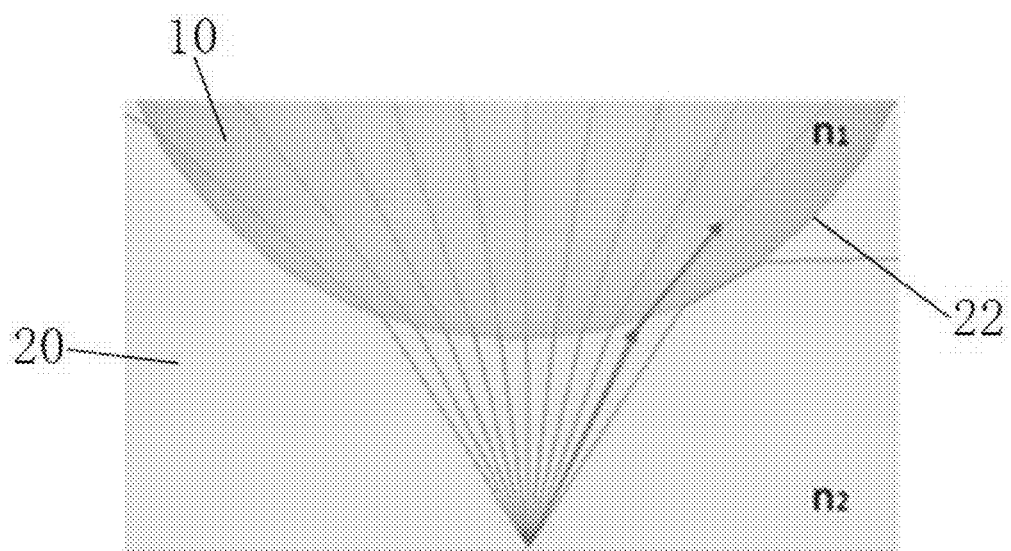
FIG. 6B is a schematic view of diffusion effect of the incident light on a second groove in the second structural layer.

FIG. 6A is a schematic view of diffusion effect of the incident light on a first groove 21 in the second structural layer 20, FIG. 6B is a schematic view of diffusion effect of the incident light on a second groove 22 in the second structural layer 20, the diffusion effects of the incident light shown in FIG. 6A and FIG. 6B are simulated by lightools. As shown in FIG. 6A and FIG. 6B, when the incident light passes through the first groove 21 and the second groove 22, one time of diffusion is performed to the incident light, respectively, after passing the two times of diffusion, the divergence angle of incident light is significantly increased, so that the brightness of the backlight is uniformed.

Figure 3:
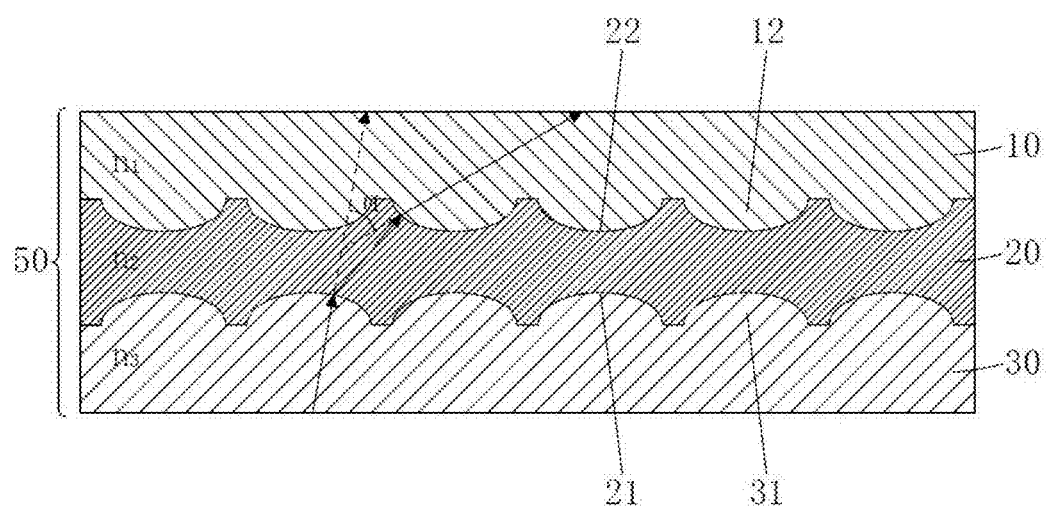
FIG. 3 is a schematic cross-sectional view of the diffusion plate in the first embodiment of the present invention.
Figure 4:
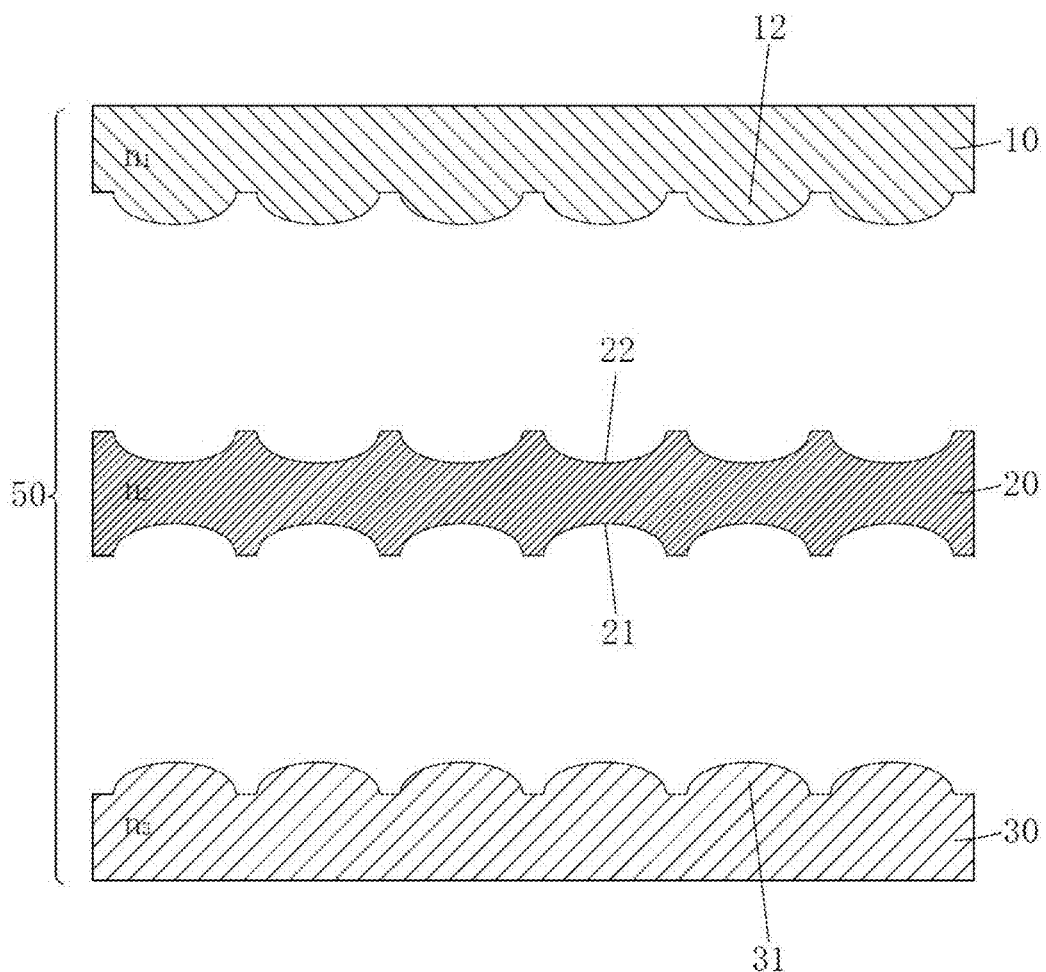
FIG. 4 is an exploded view of the diffusion plate in the first embodiment of the present invention.

FIG. 3 shows the diffusion effect for light of the diffusion plate 50 in the first embodiment of the present invention. As shown in FIG. 3, assuming that $n_1=n_2=n_3$, as shown by the broken line in FIG. 3, the transmission direction of the incident light is not changed. In the case of $n_1<n_2<n_3$, as shown by the solid line in FIG. 3, after the twice change of the transmission direction of the incident light, an angle α exists between the exit direction and the incident direction, that is to say, the divergence angle of the incident light is increased by α, so that the divergence angle of the incident light is effectively increased, the brightness of the backlight is uniformed, and the mura problem is avoided.

Figure 7:
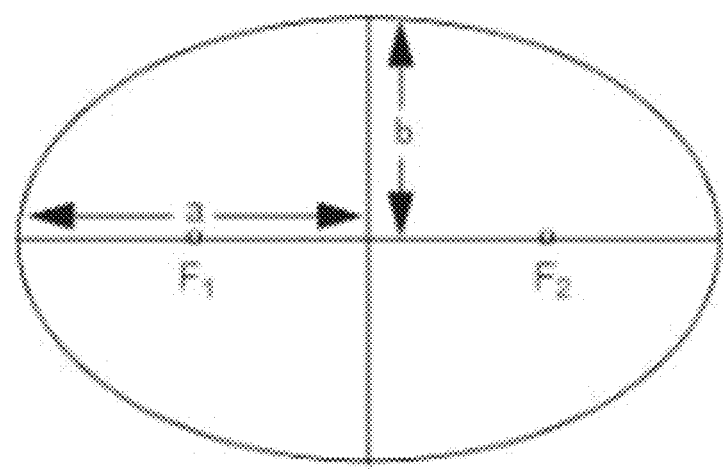
FIG. 7 is a schematic view of the corresponding position of the focal point, long axis and the short axis of the ellipse.

In order to achieve the best diffusion effect of the diffusion plate 50 of the present invention, the inventor performs the following simulation test, to obtain the optimal design parameters: the simulation experiment is the diffusion effect experiment after the timelines with curve coefficient of three values enter into the second structure layer 20 from the first groove 21:

It is known that the ellipsoid where the first groove 21 is located is a geometric body surrounded by an ellipse rotated by one long axis. Then, the curve coefficient of the ellipsoid is defined as: the curve coefficient=$(c/2a)^2$. As shown in FIG. 7, c is the distance between two focal points F1 and F2 of the ellipse, a is one-half of the major axis length of the ellipse, b is one-half of the minor axis length of the ellipse. The larger the curve coefficient, the more rounded the shape of the ellipse.

Figure 8A:
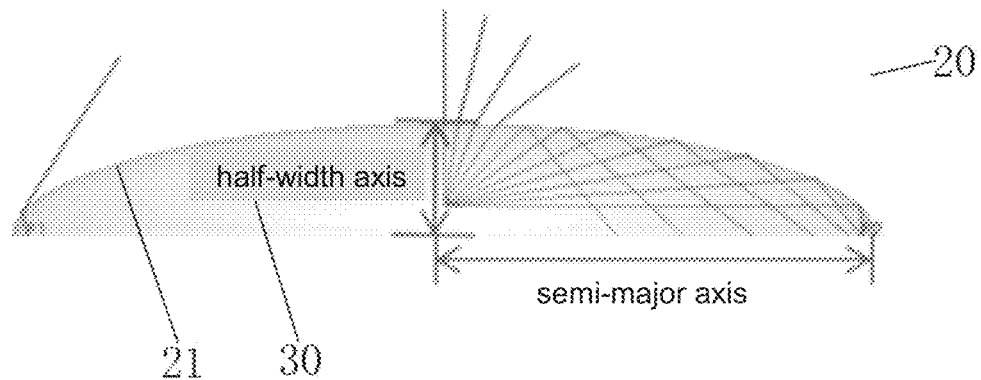
FIG. 8A is a schematic view of the diffusion effect of light entering the second structural layer from the first groove when the curve coefficient is 0.9 timeline.
Figure 8B:
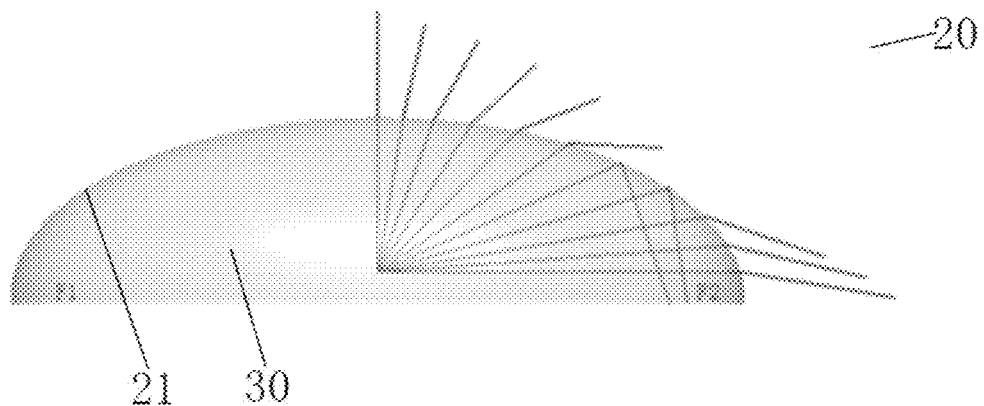
FIG. 8B is a schematic view of the diffusion effect of light entering the second structural layer from the first groove when the curve coefficient is 0.7 timeline.
Figure 8C:
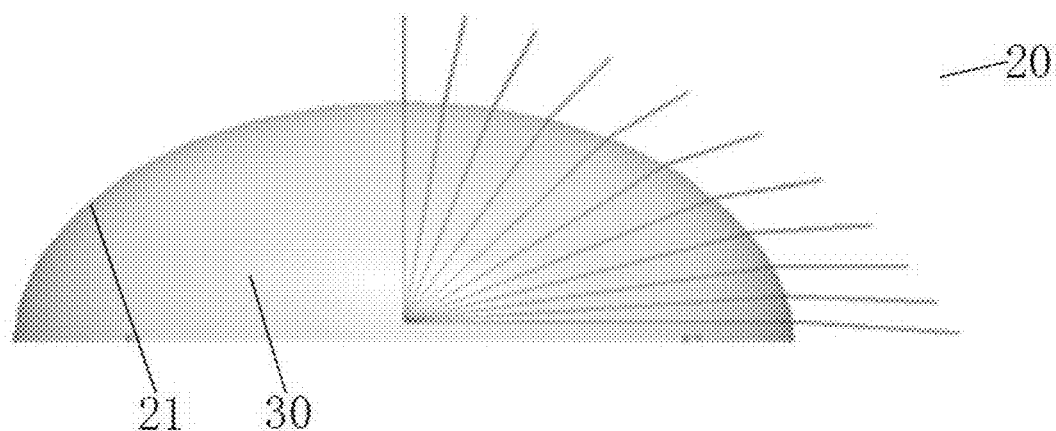
FIG. 8C is a schematic view of the diffusion effect of light entering the second structural layer from the first groove when the curve coefficient is 0.4 timeline.
Figure 9:
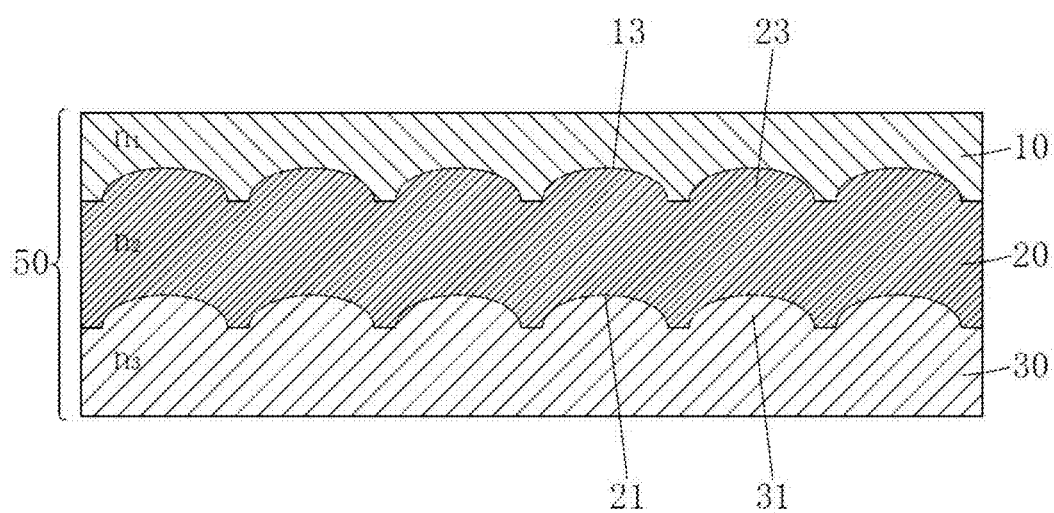
FIG. 9 is a schematic cross-sectional view of the diffusion plate in the second embodiment of the present invention.
Figure 10:
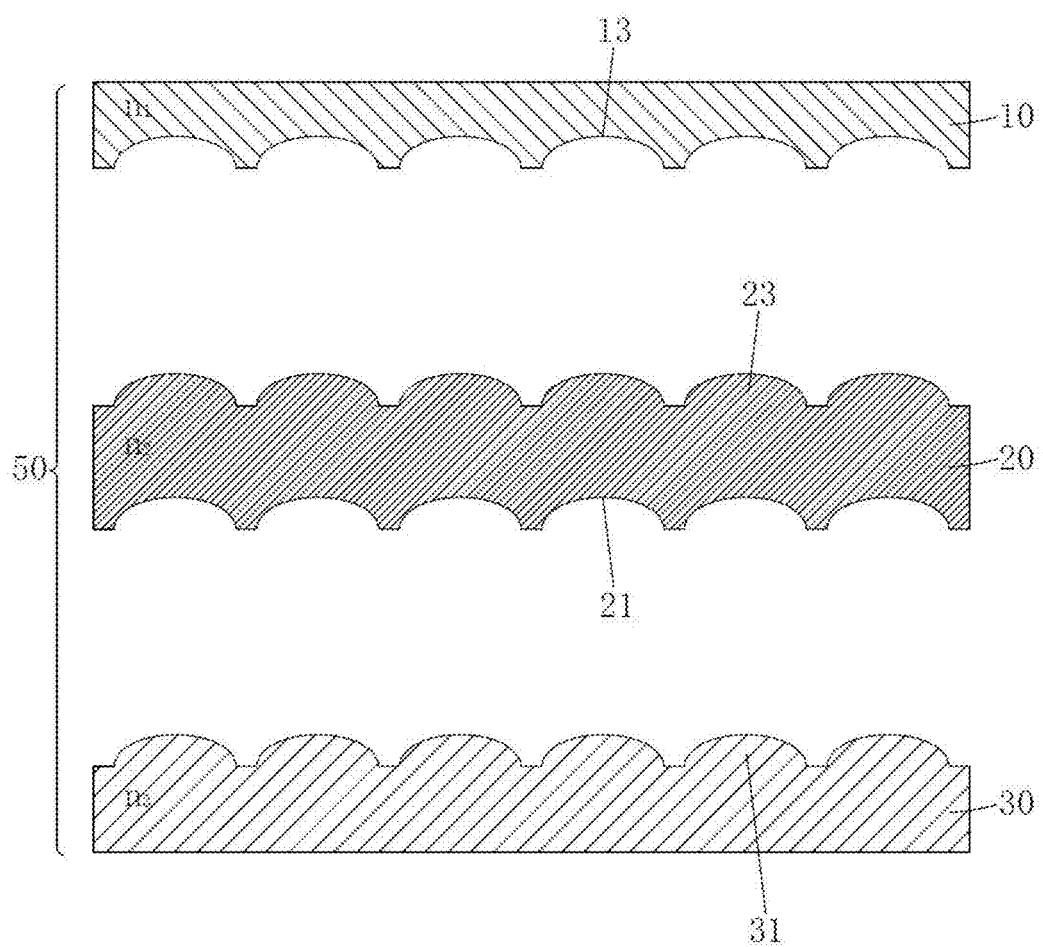
FIG. 10 is an exploded view of the diffusion plate in the second embodiment of the present invention.

In FIGS. 8A to 8C, defining one-half of the major axis of the opening of the first groove 21 is a semi-major axis, and the distance from the lowest point of the first groove 21 to the opening is a half-width axis.

FIG. 8A is a schematic view of the diffusion effect of light entering the second structural layer 20 from the first groove 21 when the curve coefficient is 0.9 timeline; As shown in FIG. 8A, the semi-major axis/half-width axis=2.5, the curve coefficient is 0.9. In the case of a curve coefficient of 0.9, about one-third of the light entering the second structure layer 20 from the first groove 21 is reflected, two-thirds of the light is total reflection, that is to say, most of the incident light is reflected back into the third structure layer 30, so the diffusion effect is poor;

FIG. 8B is a schematic view of the diffusion effect of light entering the second structural layer 20 from the first groove 21 when the curve coefficient is 0.7 timeline; As shown in FIG. 8B, the semi-major axis/half-width axis=2, the curve coefficient is 0.7. In the case of a curve coefficient of 0.7, about two-thirds of the light entering the second structure layer 20 from the first groove 21 is reflected, one-third is total reflection, that is to say, most of the incident light is capable of incident into the second structure layer 20, the diffusion effect is better;

FIG. 8C is a schematic view of the diffusion effect of light entering the second structural layer 20 from the first groove 21 when the curve coefficient is 0.4 timeline; as shown in FIG. 8C, the semi-major axis/half-width axis=1.5, the curve coefficient is 0.4. In the case of a curve coefficient of 0.4, the light entering the second structure layer 20 from the first groove 21 hardly undergoes total reflection, that is, almost all incident light is incident into the second structure layer 20, and the diffusion effect is most good.

Therefore, based on the above three experimental results, in the present invention, the curve coefficient of the first groove 21 is selected to be 0.4~0.7, within the range of the curve coefficient, the incident light has a low reflectivity and a better diffusion effect, and the range of the curve coefficient is set to cooperate to the range of refractive index parameter with $n_3/n_2<1.3$ and $n_2/n_1<1.3$ to achieve the best light diffusion effect.

Specifically, in order to achieve the best diffusion effect, the curve coefficient of the second groove 22 is also set to 0.4 to 0.7.

The method for fabricating the diffusion plate 50 of the first embodiment is: first melting the material of the second structure layer 20, and then forming the melted material of the second structure layer 20 into a thin film. Before the thin film is cured, rolling the thin film from both sides of the thin film by using a hot pressing mold with a convex surface, to obtain the second structure layer 20 with the first groove 21 and the second groove 22 on both sides respectively, and then melting the material of the first structure layer 10 and the third structure layer 30, respectively, the melted material of the first structural layer 10 and the melted material of the third structural layer 30 are respectively coated on the surface of the second structural layer 20 to form a thin film, and are cooled and solidified to obtain the first structure layer 10 and the third structure layer 30, respectively, thereby fabricating the diffusion plate 50.

In the method for fabricating the diffusion plate 50, since the microstructures on the upper and lower surfaces of the second structure layer 20 are both of a recessed structure, when the melted material thin film of the second structure layer 20 is rolled by the hot pressing mold, the shape of the groove structure of the diffusion plate 50 is easy to maintain, making the requirement for the process conditions (such as temperature) of the diffusion plate 50 are less, the process is less difficult, to ensure high production yield; and the hot pressing mold with protrusions is easy to manufacture, and lower cost.

Referring to FIG. 9 to FIG. 11B, show a second embodiment of the diffusion plate 50 according to the present invention. The microstructures on the contact surfaces of the first structure layer 10 and the second structure layer 20 in the second embodiment are different as the microstructures on the contact surfaces of the first structure layer 10 and the second structure layer 20 in the first embodiment. In the second embodiment, the surface of the second structure layer 20 in contact with the first structure layer 10 has a plurality of third protrusions 23, the surface of the first structure layer 10 in contact with the second structure layer 20 has a plurality of third grooves 13, and the shapes of the third protrusions 23 and the size respectively coincides with the shape and size of the third plurality of grooves 13.

Figure 11A:
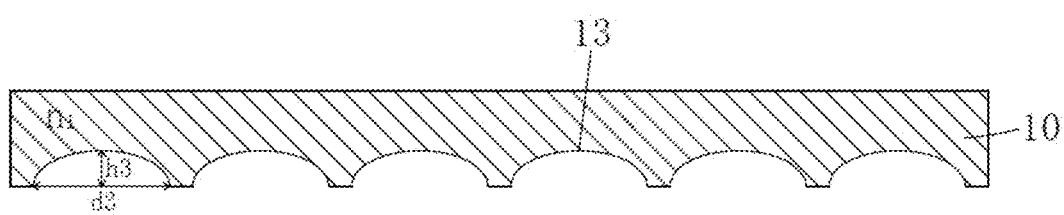
FIG. 11A is a schematic cross-sectional view of the first structure layer of the diffusion plate in the second embodiment of the present invention.
Figure 11B:
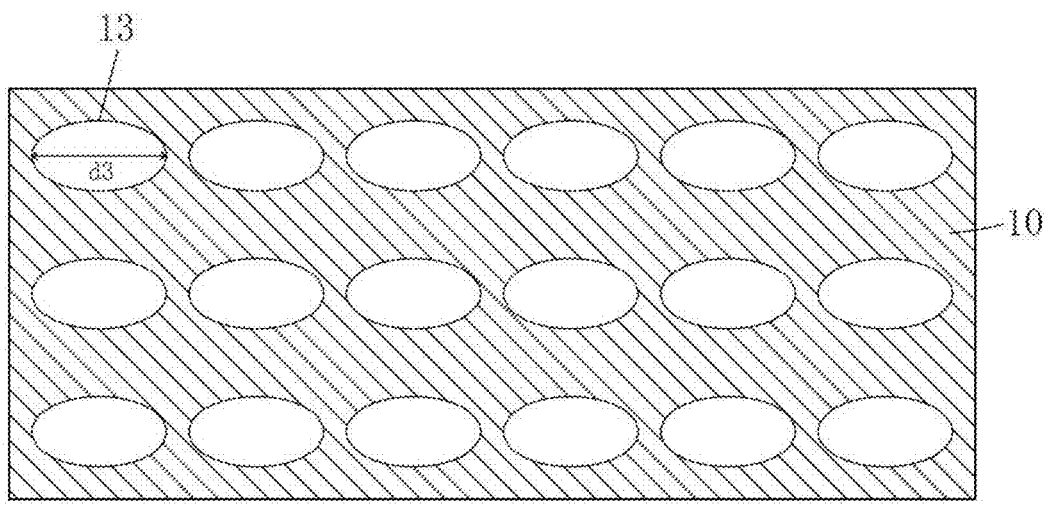
FIG. 11B is a schematic bottom view of the first structure layer of the diffusion plate in the second embodiment of the present invention.

As shown in FIG. 11A and FIG. 11B, the hollowed portion of the third groove 13 is a part of an ellipsoid, specifically less than or equal to one-half of an ellipsoid, the ellipsoid is a geometric body surrounded by an ellipse rotating around a long axis thereof, the long axis of the ellipsoid is parallel to the first structural layer 10;

The opening of the third groove 13 is oval, defining the length of the long axis of the opening of the third groove 13 is d3, the distance from the lowest point of the third groove 13 to the opening is h3, then h3<d3.

Preferably, the hollowed portion of the third groove 13 is one-half of an ellipsoid.

Specifically, the plurality of third grooves 13 are respectively disposed corresponding to the plurality of first grooves 21.

Specifically, the third groove 13 has the same shape and size as the first groove 21.

Specifically, in order to achieve the optimal diffusion effect, the curve coefficient of the third groove 13 is set to 0.4 to 0.7.

According to the light simulation results, the diffusion effect of the diffusion plate 50 of the second embodiment is superior to the diffusion effect of the diffusion plate 50 of the first embodiment described above, but compared with the diffusion plate 50 of the first embodiment, the difficult to fabricating the second structure layer 20 of the diffusion plate 50 in the second embodiment is increased.

By disposing the first groove 21 on the light incident side of the second structure layer 20 of the diffusion plate 50, disposing the second groove 22 or the third protrusions 23 on the light emitting side of the second structure layer 20, and the refractive index of the first structure layer 10, the second structure layer 20 and the third structure layer 30 is sequentially increased, the divergence angles of the incident light can be significantly increased, to achieve uniform backlight brightness, when the diffusion plate 50 is used in the direct-type backlight module, the mura problem can be solved while reducing the number of LED lamps and the light mixing distance, so as to realize the low cost and slim design of the direct-type backlight module.

Figure 12:
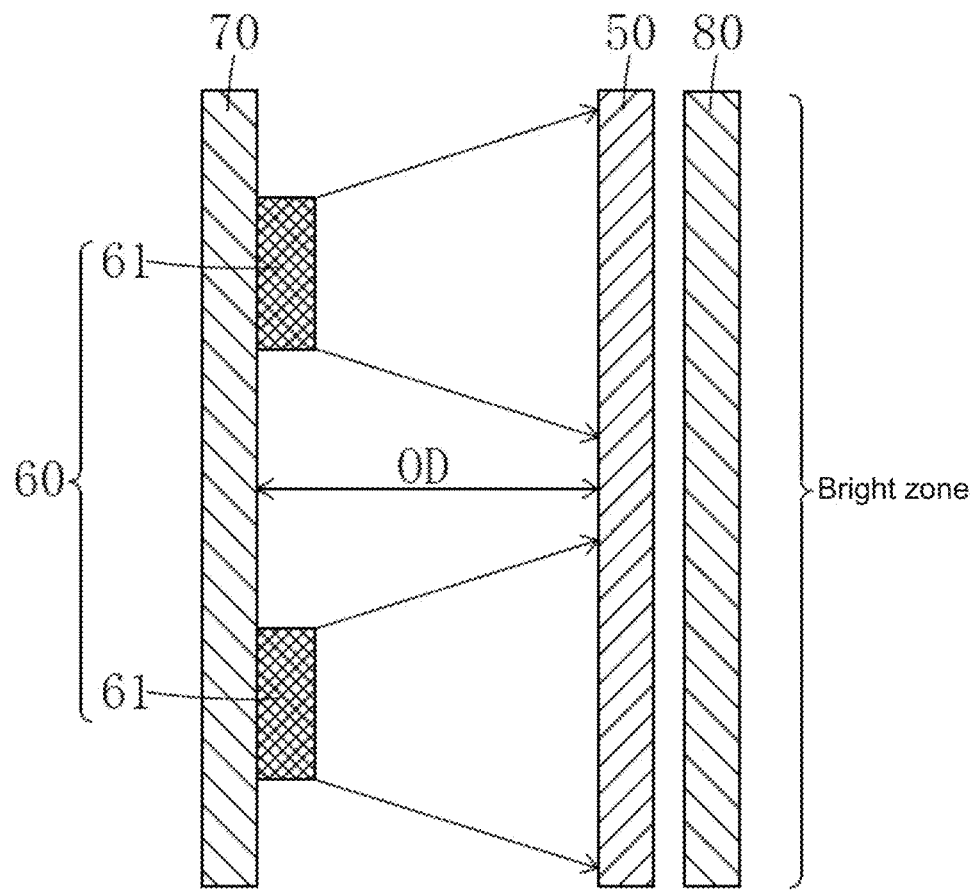
FIG. 12 is a schematic structural diagram of the direct-type backlight module of the present invention.

Referring to FIG. 12, while referring to FIG. 3 to FIG. 11B, based on the diffusion plate 50 above, the present invention further provides a direct-type backlight module, including a light source 60, the diffusion plate 50 disposed on the light emitting side of the light source 60. The third structure layer 30 of the diffusion plate 50 is disposed toward the light source 60.

Specifically, the light source 60 includes a plurality of LED lamps 61 arranged at intervals.

Specifically, the direct-type backlight module further includes a reflection sheet 70 disposed on a side of the light source 60 away from the diffusion plate 50 configured to reflect a portion of the light emitted by the light source 60 and emitted in a direction away from the diffusion plate 50, so as to improve light utilization efficiency of the backlight 60.

Preferably, the direct-type backlight module further includes an optical film 80 disposed on a side of the diffusion plate 50 away from the light source 60. The optical film 80 may be a brightness enhancement film.

The direct-type backlight module includes the diffusion plate 50 described above. Since the diffusion plate 50 is excellent in diffusing light, the mura problem can be solved while reducing the number of the LED lamps 61 and the light mixing distance, so as to realize the low cost and slim design of the direct-type backlight module, and are conducive to the use of the direct-type backlight module in the ultra-thin TV field.

In summary, the present invention provides a diffusion plate and a direct-type backlight module. By disposing the first groove on the light incident side of the second structure layer of the diffusion plate, disposing the second groove or the third protrusions on the light emitting side of the second structure layer, and the refractive index of the first structure layer, the second structure layer and the third structure layer is sequentially increased, the divergence angles of the incident light can be significantly increased, to achieve uniform backlight brightness. The direct-type backlight module of the present application includes the diffusion plate described above. Since the diffusion plate is excellent in diffusing light, the mura problem can be solved while reducing the number of the LED lamps and the light mixing distance, so as to realize the low cost and slim design of the direct-type backlight module, and are conducive to the use of the direct-type backlight module in the ultra-thin TV field.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A diffusion plate, comprising:
   a first structure layer, a second structure layer and a third structure layer disposed from top to bottom sequentially, wherein a side of the third structure layer far from the second structure layer is a light incident side;
   defining a refractive index of the first structure layer as $n_1$, a refractive index of the second structure layer as $n_2$, and the refractive index of the third structure layer as $n_3$, and $n_1<n_2<n_3$;
   a contact surface between the first structure layer and the second structure layer in close contact, a contact surface between the second structure layer and the third structure layer in close contact;
   wherein a plurality of first grooves are provided on a surface of the second structure layer in contact with the third structure layer, a plurality of first protrusions are provided on a surface of the third structure layer in contact with the second structure layer, shapes and sizes of the first protrusions coincide with shapes and sizes of the first grooves, respectively;
   wherein a hollowed portion of the first groove is a part of an ellipsoid, specifically less than or equal to one-half of the ellipsoid, the ellipsoid is a geometric body surrounded by an ellipse rotating around a long axis of the ellipse, the long axis of the ellipsoid is parallel to the second structural layer; and
   an opening of the first groove is oval, defining a length of a long axis of the opening of the first groove is d1, a distance from a lowest point of the first groove to the opening is h1, and h1<d1.

2. The diffusion plate according to claim 1, wherein the hollowed portion of the first groove is one-half of the ellipsoid.

3. The diffusion plate according to claim 1, wherein a curve coefficient of the first groove is 0.4~0.7, the refractive index of $n_1$, $n_2$, $n_3$ meets the following relationship of $n_3/n_2<1.3$ and $n_2/n_1<1.3$.

4. The diffusion plate according to claim 1, wherein a contact surface between the second structure layer and the first structure layer has a plurality of second grooves, the contact surface between the first structure layer and the second structure layer has a plurality of second protrusions, shapes and sizes of the second protrusions coincide with shapes and sizes of the second grooves, respectively.

5. The diffusion plate according to claim 4, wherein a hollowed portion of the second groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the second structural layer; and an opening of the second groove is oval, defining a length of a long axis of the opening of the second groove is d2, a distance from a lowest point of the second groove to the opening is h2, and h2<d2.

6. The diffusion plate according to claim 1, wherein the contact surface between the second structure layer and the first structure layer has a plurality of third protrusions, the contact surface between the first structure layer and the second structure layer has a plurality of third grooves, shapes and sizes of the third protrusions coincide with shapes and sizes of the third grooves, respectively.

7. The diffusion plate according to claim 6, wherein a hollowed portion of the third groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the first structural layer; and an opening of the third groove is oval, defining a length of a long axis of the opening of the third groove is d3, a distance from a lowest point of the third groove to the opening is h3, and h3<d3.

8. A direct-type backlight module, comprising a light source, a diffusion plate disposed on a light emitting side of the light source, the diffusion plate, comprising a first structure layer, a second structure layer and a third structure layer disposed from top to bottom sequentially, wherein a side of the third structure layer far from the second structure layer is a light incident side;

defining a refractive index of the first structure layer as $n_1$, a refractive index of the second structure layer as $n_2$, and the refractive index of the third structure layer as $n_3$, and $n_1<n_2<n_3$;

a contact surface between the first structure layer and the second structure layer in close contact, a contact surface between the second structure layer and the third structure layer in close contact;

wherein a plurality of first grooves are provided on a surface of the second structure layer in contact with the third structure layer, a plurality of first protrusions are provided on a surface of the third structure layer in contact with the second structure layer, shapes and sizes of the first protrusions coincide with shapes and sizes of the first grooves, respectively; and the third structure layer of the diffusion plate disposed toward the light source;

wherein a hollowed portion of the first groove is a part of an ellipsoid, specifically less than or equal to one-half of the ellipsoid, the ellipsoid is a geometric body surrounded by an ellipse rotating around a long axis of the ellipse, the long axis of the ellipsoid is parallel to the second structural layer; and an opening of the first groove is oval, defining a length of a long axis of the opening of the first groove is d1, a distance from a lowest point of the first groove to the opening is h1, and h1<d1.

9. The direct-type backlight module according to claim 8, wherein the light source comprises a plurality of LED lamps arranged at intervals, and the direct-type backlight module further comprises a reflection sheet disposed on a side of the light source away from the diffusion plate and an optical film disposed on a side of the diffusion plate away from the light source.

10. The direct-type backlight module according to claim 8, wherein the hollowed portion of the first groove is one-half of the ellipsoid.

11. The direct-type backlight module according to claim 8, wherein a curve coefficient of the first groove is 0.4~0.7, the refractive index of $n_1$, $n_2$, $n_3$ meets the following relationship of $n_3/n_2<1.3$ and $n_2/n_1<1.3$.

12. The direct-type backlight module according to claim 8, wherein a contact surface between the second structure layer and the first structure layer has a plurality of second grooves, the contact surface between the first structure layer and the second structure layer has a plurality of second protrusions, shapes and sizes of the second protrusions coincide with shapes and sizes of the second grooves, respectively.

13. The direct-type backlight module according to claim 12, wherein a hollowed portion of the second groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the second structural layer;

an opening of the second groove is oval, defining a length of a long axis of the opening of the second groove is d2, a distance from a lowest point of the second groove to the opening is h2, and h2<d2.

14. The direct-type backlight module according to claim 8, wherein the contact surface between the second structure layer and the first structure layer has a plurality of third protrusions, the contact surface between the first structure layer and the second structure layer has a plurality of third grooves, shapes and sizes of the third protrusions coincide with shapes and sizes of the third grooves, respectively.

15. The direct-type backlight module according to claim 14, wherein a hollowed portion of the third groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the first structural layer;

an opening of the third groove is oval, defining a length of a long axis of the opening of the third groove is d3, a distance from a lowest point of the third groove to the opening is h3, and h3<d3.

16. A diffusion plate, comprising:
a first structure layer, a second structure layer and a third structure layer disposed from top to bottom sequentially, wherein a side of the third structure layer far from the second structure layer is a light incident side;
defining a refractive index of the first structure layer as $n_1$, a refractive index of the second structure layer as $n_2$, and the refractive index of the third structure layer as $n_3$, and $n_1<n_2<n_3$;
a contact surface between the first structure layer and the second structure layer in close contact, a contact surface between the second structure layer and the third structure layer in close contact;
wherein a plurality of first grooves are provided on a surface of the second structure layer in contact with the third structure layer, a plurality of first protrusions are provided on a surface of the third structure layer in contact with the second structure layer, shapes and sizes of the first protrusions coincide with shapes and sizes of the first grooves, respectively;
wherein a hollowed portion of the first groove is a part of an ellipsoid, specifically less than or equal to one-half of the ellipsoid, the ellipsoid is a geometric body surrounded by an ellipse rotating around a long axis of the ellipse, the long axis of the ellipsoid is parallel to the second structural layer;
an opening of the first groove is oval, defining a length of a long axis of the opening of the first groove is d1, a distance from a lowest point of the first groove to the opening is h1, and h1<d1;

wherein the hollowed portion of the first groove is one-half of the ellipsoid;

wherein a contact surface between the second structure layer and the first structure layer has a plurality of second grooves, the contact surface between the first structure layer and the second structure layer has a plurality of second protrusions, shapes and sizes of the second protrusions coincide with shapes and sizes of the second grooves, respectively;

wherein a hollowed portion of the second groove is a part of the ellipsoid, specifically less than or equal to one-half of the ellipsoid, the ellipsoid is a geometric body surrounded by an ellipse rotating around a long axis of the ellipse, the long axis of the ellipsoid is parallel to the second structural layer; and an opening of the second groove is oval, defining a length of a long axis of the opening of the second groove is d2, a distance from a lowest point of the second groove to the opening is h2, and h2<d2.

17. The diffusion plate according to claim 16, wherein a curve coefficient of the first groove is 0.4~0.7, the refractive index of $n_1$, $n_2$, $n_3$ meets the following relationship of $n_3/n_2<1.3$ and $n_2/n_1<1.3$.

* * * * *